US008793010B2

(12) United States Patent
Stanish et al.

(10) Patent No.: US 8,793,010 B2
(45) Date of Patent: Jul. 29, 2014

(54) METHOD FOR REDUCING OVERALL VARIABILITY OF MOISTURE CONTENT IN WOOD PRODUCTS

(75) Inventors: Mark A. Stanish, Seattle, WA (US); John E. Jones, III, Seattle, WA (US); John N. Giovanini, Gig Harbor, WA (US)

(73) Assignee: Weyerhaeser NR Company, Federal Way, WA (US)

( * ) Notice: Subject to any disclaimer, the term of this patent is extended or adjusted under 35 U.S.C. 154(b) by 661 days.

(21) Appl. No.: 12/913,160

(22) Filed: Oct. 27, 2010

(65) Prior Publication Data

US 2011/0314690 A1 Dec. 29, 2011

Related U.S. Application Data

(60) Provisional application No. 61/329,485, filed on Apr. 29, 2010.

(51) Int. Cl.

*G05B 13/02* (2006.01)
*G06F 19/00* (2011.01)
*G01D 18/00* (2006.01)
*G01R 35/00* (2006.01)
*G01R 27/04* (2006.01)
*F26B 5/06* (2006.01)
*F26B 25/22* (2006.01)

(52) U.S. Cl.

CPC ............ *F26B 25/22* (2013.01); *F26B 2210/16* (2013.01)

USPC ............... 700/208; 700/51; 700/108; 702/85; 702/108; 324/640; 34/282

(58) Field of Classification Search

USPC ............ 324/601, 640, 665; 702/85, 108, 127, 702/183; 700/51, 52, 108, 208, 275; 34/90, 34/282, 396, 489, 522

See application file for complete search history.

(56) References Cited

U.S. PATENT DOCUMENTS

| | | | | |
|---|---|---|---|---|
| 6,124,584 | A * | 9/2000 | Blaker et al. | 219/779 |
| 7,043,970 | B2 * | 5/2006 | Ristea et al. | 73/73 |
| 7,068,050 | B2 * | 6/2006 | Steele et al. | 324/640 |

(Continued)

FOREIGN PATENT DOCUMENTS

EP 1801580 A2 6/2007

OTHER PUBLICATIONS

Amazous et al., Use of multivariate data analysis for lumberdrying process monitoring and fault detection, Jan. 2006; In proceeding of: Proceedings of the 2006 International Conference on Data Mining, DMIN 2006, Las Vegas, Nevada, USA, Jun. 26-29, 2006.*

(Continued)

*Primary Examiner* — Darrin Dunn

(74) *Attorney, Agent, or Firm* — Weyerhaeuser Law Dept

(57) ABSTRACT

The present disclosure includes a method for quantifying contribution to overall variability of moisture content in wood products and associated computer software. The method comprises the steps of obtaining moisture content data for the wood products and identifying one or more sources of variability in the moisture content data. A contribution to overall variability from each of the one or more sources of variability is then quantified. One or more opportunities to impact the overall variability are then quantified, each of the one or more opportunities being associated with one or more executable steps.

18 Claims, 8 Drawing Sheets

(56) References Cited

U.S. PATENT DOCUMENTS

| | | | | |
|---|---|---|---|---|
| 7,130,040 | B2 * | 10/2006 | Lindgren et al. | 356/300 |
| 7,584,652 | B2 * | 9/2009 | Floyd et al. | 73/73 |
| 2005/0040832 | A1 * | 2/2005 | Steele et al. | 324/640 |
| 2005/0115307 | A1 * | 6/2005 | Ristea et al. | 73/73 |
| 2006/0185441 | A1 * | 8/2006 | Wang et al. | 73/801 |
| 2007/0137323 | A1 * | 6/2007 | Floyd et al. | 73/866 |
| 2007/0143075 | A1 * | 6/2007 | Floyd et al. | 702/183 |
| 2008/0161972 | A1 * | 7/2008 | Magill | 700/275 |
| 2008/0243270 | A1 * | 10/2008 | Jones et al. | 700/51 |
| 2010/0087950 | A1 * | 4/2010 | Wagner et al. | 700/208 |

OTHER PUBLICATIONS

Luiz, Experimental evaluation and modeling of high temperature drying of sub-alpine fire, Wood Sci Technol, 2009.*

Gu et al., Potential sources of variation that influence the final moisture content of kiln-dried hardwood lumber, Forest Products Journal , vol. 54, No. 11, 2004.*

Kuehl, R.O. (2000) "Design of Experiments: Statistical Principles of Research Design and Analysis", Duxbury Press.

Pinheiro, J.C., and Bates, D.M. (2000) "Mixed-Effects Models in S and S-PLUS", Springer, NY.

* cited by examiner

METHOD FOR REDUCING OVERALL VARIABILITY OF MOISTURE CONTENT IN WOOD PRODUCTS

CROSS-REFERENCE TO RELATED APPLICATIONS

This application is entitled to and claims the benefit of priority under 35 U.S.C. §119 from U.S. Provisional Patent Application Ser. No. 61/329,485 filed Apr. 29, 2010, and titled "Method for Quantifying Contribution to Overall Variability of Moisture Content in Wood Products," the contents of which are incorporated herein by reference.

This application relates to U.S. patent application Ser. No. 12/913,198 filed on the same day as the present patent application, and titled "Method for Optimizing Value of Wood Products Dried in a Drying Process," the contents of which are incorporated herein by reference.

TECHNICAL FIELD

The present disclosure is directed generally to methods for quantifying contribution to overall variability of moisture content in wood products, reducing such overall variability, and related computer software.

BACKGROUND

When a log is sawn, the wood contains very large amounts of water. Accordingly products made from wood materials (e.g., lumber, veneer products, wood strand products) naturally contain moisture. Companies that manufacture such products seek to reduce this initial moisture content in order to avoid problems associated with dimensional stability, durability, appearance, shipping costs, fungal damage, and other issues.

Wood products are often classified and sorted into grades indicating quality and suitability for a particular use. In the lumber industry, formal grading systems are used to maintain standards so that lumber in a given grade can be used for the same application. Lumber grading is based on many factors including density, defects, and moisture content. Formal and informal grading systems based on similar factors also exist for veneers, strands, and other wood materials. Because higher grade materials generally sell for a premium price, moisture content is an important factor, which relates to product value.

Many companies that manufacture wood products employ various drying methods (e.g., kiln drying, air drying, shed drying) to reduce moisture content of their products before sale. Although companies use controlled drying processes and various monitoring technologies, it is difficult to ensure that every wood product dried in a given process will exhibit exactly the same moisture content after drying. In a kiln drying process, for example, moisture variations can result from variable drying conditions between different kilns at the same mill or within a single kiln charge. Accordingly, there is an opportunity to capture increased wood product value from improved management of moisture content. Thus, there is a need to develop a method for identifying sources of variability within drying processes for wood products and quantifying the contribution to variability from each of the sources.

SUMMARY

The following summary is provided for the benefit of the reader only and is not intended to limit in any way the invention as set forth by the claims. The present disclosure is directed generally towards methods for quantifying contribution to overall variability of moisture content in wood products, reducing such variability, and related computer software.

In one embodiment, the disclosure includes a method for reducing overall variability of moisture content in wood products. The method comprises the steps of obtaining moisture content data for the wood products and identifying one or more sources of variability in the moisture content data. A contribution to overall variability from each of the one or more sources of variability is then quantified. One or more opportunities to impact the overall variability, based on the one or more sources, are then quantified, each of the one or more opportunities being associated with one or more executable steps. In some embodiments, the method further comprises the steps of prioritizing the executable steps, selecting one or more executable steps based on prioritization, and performing one or more executable steps.

Further aspects of the disclosure are directed towards a computer-readable storage medium. The computer-readable storage medium stores computer-executable instructions that, when executed, by a processor of a computing system, cause the computing system to receive moisture data for wood products, quantify a contribution to overall variability from each of one or more sources of variability, and quantify impact on variability associated with one or more opportunities. Each of the opportunities is associated with one or more executable steps. In some embodiments, the computing system may output a prioritization of the one or more executable steps.

BRIEF DESCRIPTION OF THE DRAWINGS

The present disclosure is better understood by reading the following description of non-limitative embodiments with reference to the attached drawings wherein like parts of each of the figures are identified by the same reference characters, and are briefly described as follows.

DETAILED DESCRIPTION

The present disclosure describes methods for quantifying contribution to overall variability of moisture content in wood products, opportunities for impacting variability, and related computer software. Certain specific details are set forth in the following description and FIGS. 3-8 to provide a thorough understanding of various embodiments of the disclosure. Well-known structures, systems, and methods often associated with such systems have not been shown or described in details to avoid unnecessarily obscuring the description of various embodiments of the disclosure. In addition, those of ordinary skill in the relevant art will understand that additional embodiments of the disclosure may be practiced without several of the details described below.

In this disclosure, the term "wood product" is used to refer to a product manufactured from logs such as lumber (e.g., boards, dimension lumber, headers, beams, timbers, mouldings, laminated, finger jointed, or semi-finished lumber); veneer products; or wood strand products (e.g., oriented strand board, oriented strand lumber, laminated strand lumber, parallel strand lumber, and other similar composites); or components of any of the aforementioned examples. The term "drying process" is used to describe any process performed by a drying device for removing moisture from wood products including but not limited to kiln drying, air drying, shed drying, veneer drying, rotary-drum drying and other processes known to a person of ordinary skill in the art for removing moisture from wood. The term "MBF" is used as an abbreviation for thousand of board feet. The term "MC" is used as an abbreviation for "moisture content." The term "variability" is used herein to describe the degree to which a set of data is spread out or clustered.

Figure 1:
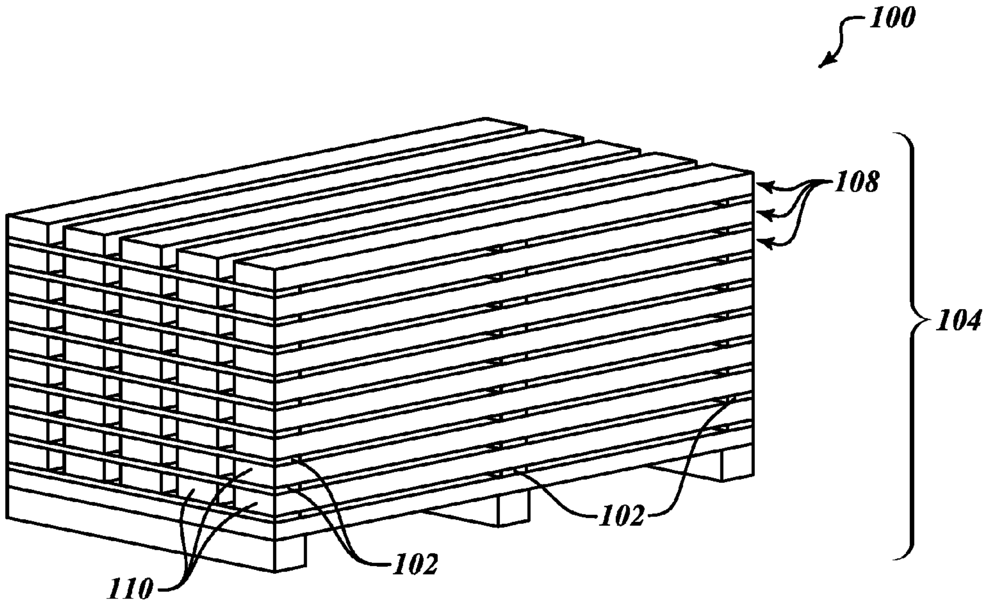
FIG.1 (PRIOR ART)
FIG. 1 is a schematic of a stack of lumber to illustrate terminology for lumber drying.

For simplification, the disclosure describes embodiments referencing application of the methods described in the lumber industry. FIG. 1 is a schematic describing common lumber drying terminology. FIG. 1 shows a stack of lumber 100 for kiln drying, shed drying, air drying, or use in other drying methods. Proper stacking will take advantage of wood's drying properties. The lumber stack 100 is generally uniform in length. Small uniform-sized boards known as "stickers" 102 are often used to provide space for air to move across the lumber surfaces.

In kiln drying, a "charge" includes all of the lumber put into the kiln at one time. A car is loaded with a lumber stack such as the one shown in FIG. 1. Multiple cars may be lined up on a track and some kilns are equipped with multiple tracks. Each charge comprises one or more packages 104. Each package 104 comprises one or more courses 108. Courses 108 are individual rows that make up a package 102. Each course 108 comprises one or more pieces 110. Pieces 110 are individual components of the wood product. In the lumber example, a piece 110 may be a single board. A person of ordinary skill in the art will understand that the methods described herein may be applied to other wood products not specifically mentioned in the disclosure. Furthermore, embodiments described in the disclosure may be used with drying processes not specifically mentioned, but that would be known to a person of ordinary skill in the art.

Figure 2:
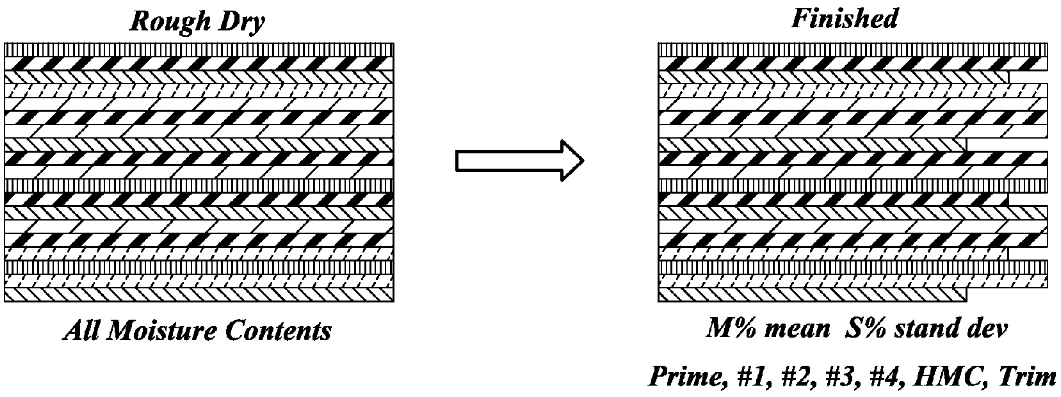
FIG. 2 (PRIOR ART)
FIG. 2 depicts a conventional "grade-out" approach to wood product quality and value assessment.

In lumber manufacturing, product quality and value are commonly assessed using grading data from planer mills. Reports are generated in the form of a so-called "grade-out," which provides a breakdown of the volume percentage of each grade in a certain lumber population. That population may be from a single planer shift, or it could be from some other production interval, e.g., a week, a month, etc. FIG. 2 depicts a conventional "grade-out" approach to wood product quality and value assessment.

The grade-out depends in part on the moisture content characteristics of the corresponding lumber population. Populations with higher average moisture contents generally have higher proportions of Wet or High Moisture Content (HMC) grades. Those with lower moisture contents have a greater incidence of drying-related degrade, including warp, splits, checks, and planer skip, and therefore have higher proportions of lower-value grades. To help account for the effects of moisture content on grade-out, the moisture content distribution or related statistical metrics (mean and standard deviation) may be compiled and reported along with the grade-out.

In general, drying outcomes differ in average moisture content and/or in moisture content variability, both of which influence value. For drying improvement, the differences in value that result from differences in moisture content are often especially important. Using grade-outs to establish lumber value in such comparisons is challenging because the moisture content distributions of the grade-out populations usually do not closely match the distributions under consideration. Furthermore, even when those moisture content distributions are very similar, it can be difficult to determine value accurately because of the variability that is caused by factors other than moisture content. For both reasons, grade-outs are of limited use for resolving value differences between different drying outcomes. Accordingly, there is an opportunity to capture increased lumber value from improved management of moisture content. This opportunity can be viewed as consisting of two components: (a) that from optimal targeting of final moisture content, to better balance value losses due to over-drying and under-drying and thus provide maximum value at the existing level of moisture content variability; and (b) that from controlling or impacting moisture content variability (standard deviation) to further increase average lumber value.

Figure 3:
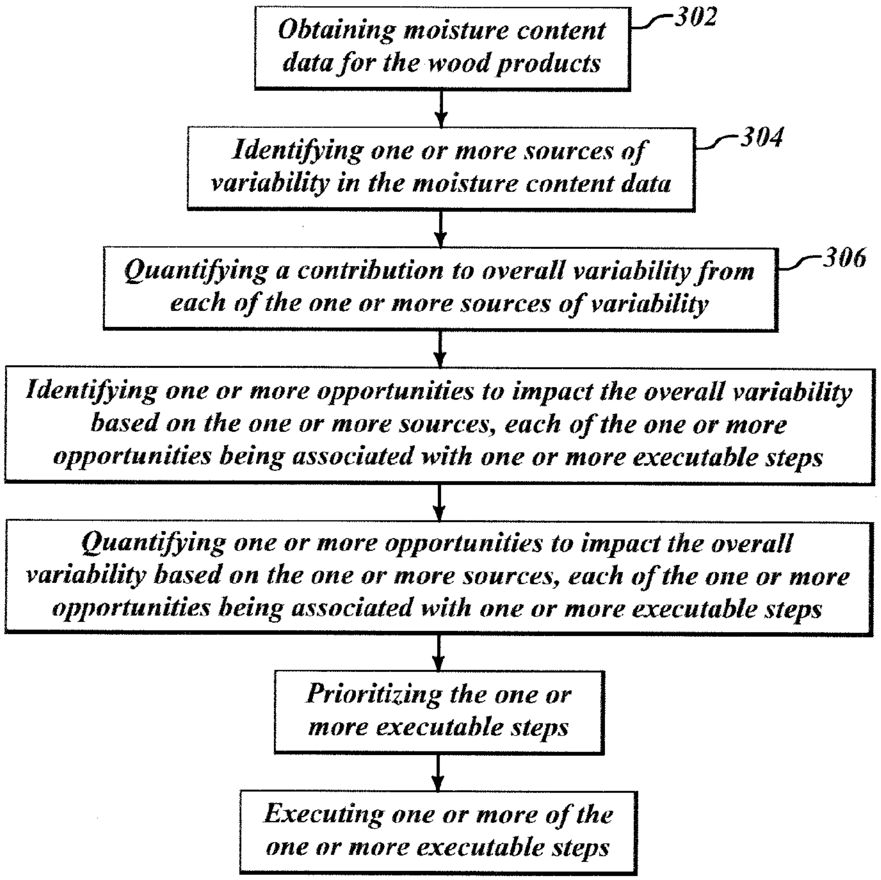
FIG. 3 is a schematic of a method for quantifying contribution to overall variability of moisture content in wood products.

FIG. 3 is a schematic of a method 300 for quantifying contribution to overall variability of moisture content in wood products according to the disclosure. The method begins with step 302, obtaining moisture content data for the wood products dried in one or more drying processes (e.g., kiln drying). Moisture content data may be obtained using any method and/or equipment that is known to a person of ordinary skill in the art. In some embodiments, moisture content data may be purchased from a third party and/or imported for use with methods according to the disclosure.

Step 304 includes identifying one or more sources of variability in the moisture content data. In some embodiments, the sources of variability include charge-to-charge differences, package-to-package differences, course-to-course differences, within-course differences, and piece-to-piece differences. In some embodiments, sources of variability may include one of the above-mentioned sources or any combination of the above-mentioned sources. In lumber applications, charge-to-charge differences are, for example, variability in moisture content between individual kiln charges. Package-to-package differences are, for example, variability in moisture content between individual packages. Course-to-course differences are, for example, variability in moisture content between individual courses. Within-course differences are, for example, variability in moisture content within individual courses. Piece-to-piece differences are, for example, variability in moisture content between individual wood products (boards, in the case of lumber). A person of ordinary skill in the art will appreciate that modified terminology may be used in non-lumber applications to refer to sources of variability in moisture content for wood products.

Step 306 includes quantifying a contribution to overall variability from each of the one or more sources of variability. A variety of methods may be used to quantify the contribution from each of these sources to the overall variability. For example, one method may include estimating an ideal standard deviation for each of the sources (ideal source standard deviation), calculating an actual standard deviation for each of the sources (actual source standard deviation), and calculating the difference between the ideal source standard deviation and the actual source standard deviation. In embodiments according to the disclosure, graphical methods or computational methods may be used to determine this difference. Quantification of contribution to variability may also be determined using statistical methods according to this disclosure. Exemplary graphical methods will now be described with reference to FIGS. 4-6.

Figure 4:
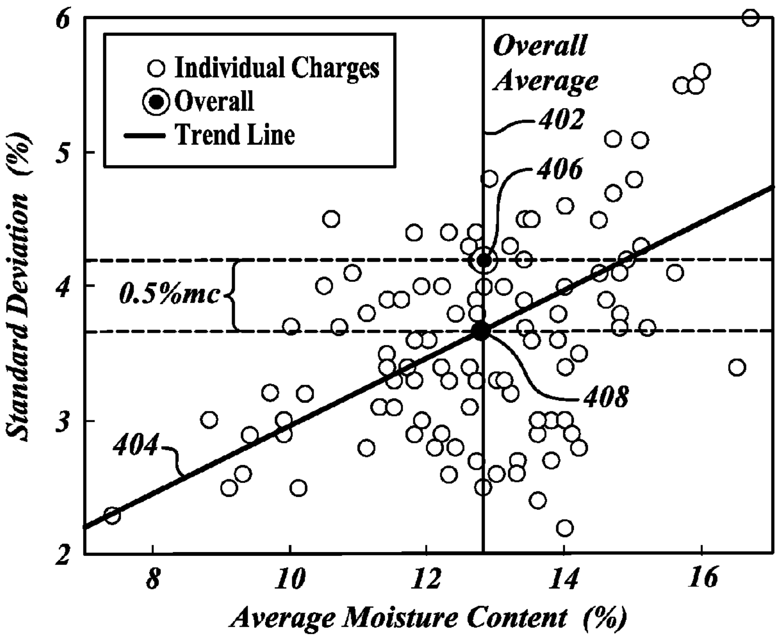
FIG. 4 is a plot of standard deviation of each charge against average moisture content for each charge.
Figure 5:
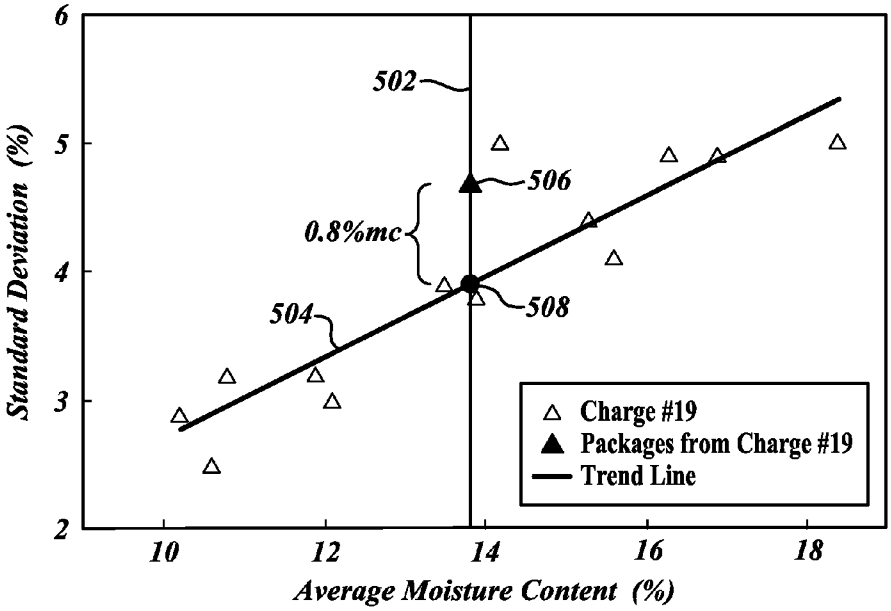
FIG. 5 is a plot of standard deviation of each package against average moisture content for each package.

To quantify contributions from charge-to-charge differences, methods according to the disclosure analyze the relationship between average moisture content and the standard deviation of each charge. FIG. 4 is an exemplary plot of standard deviation of each charge against average moisture content for each charge. In methods according to the disclosure, one can calculate a population-average moisture content from prior moisture content data. The population-average moisture content is shown on FIG. 4 by line 402. A charge trend line 404 may be estimated by using any suitable method known to a person of ordinary skill in the art such as a least squares regression model, least trimmed squares, quantile regression, and scatterplot smoothers such as smoothing splines or loess. The intersection of the charge trend line 404 with the population-average moisture content 402 provides an estimate of what the standard deviation would be if all charges were dried to that same average moisture content. In this disclosure, this is referred to as ideal population standard deviation 408. Actual population standard deviation 406 is shown on FIG. 4. Subtracting the ideal charge standard deviation 408 from the actual population standard deviation 406 provides an estimate of the contribution to overall variability from charge-to-charge differences. In the example shown in FIG. 4, the estimate for this contribution to overall standard deviation is about 0.5% MC.

A similar method can be repeated for other sources of variability. An exemplary plot of standard deviations and average moisture contents for the packages within a particular charge (FIG. 5) is similar in appearance to FIG. 4. In methods according to the disclosure, one can calculate a charge-average moisture content from prior moisture content data. The charge-average moisture content is shown on FIG. 5 by line 502. A package trend line 504 may be estimated using methods described above with respect to the charge trend line 404. The intersection of the package trend line 504 with the package-average moisture content 502 provides an estimate of what the standard deviation would be if all packages were dried to that same average moisture content (referred to as ideal charge standard deviation 508). Actual charge standard deviation 506 is shown on FIG. 5. Subtracting the ideal package standard deviation 508 from the actual charge standard deviation 506 provides an estimate of the contribution to overall variability from package-to-package differences. In the above example, the estimate for this contribution to overall standard deviation is about 0.8% MC. Within packages, the average moisture content of each course may differ from that of the other courses. To estimate the contribution to overall moisture variability from course-to-course differences, methods according to the disclosure analyze how the standard deviation and the average moisture content of each course within a package relate to one another.

Figure 6:
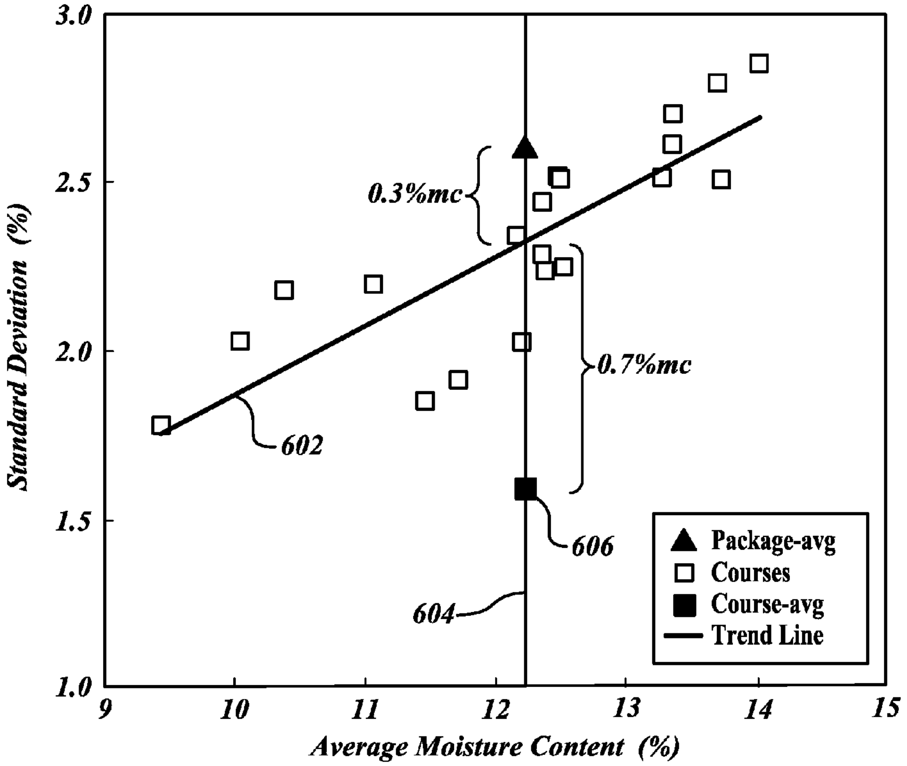
FIG. 6 is plot of standard deviations and average moisture contents for the courses within a particular package.

A plot of standard deviations and average moisture contents for the courses within a particular package is shown in FIG. 6. A course trend line 602 may be estimated using methods described above with respect to the charge trend line 404 and the package trend line 504. The intersection of the course trend line 602 with a package-average moisture content 604 provides an estimate of what the package standard deviation would be if all courses in that package were dried to the same average moisture content (ideal package standard deviation). The difference between the ideal package standard deviation and the actual standard deviation for that package provides an estimate of the contribution to package variability from course-to-course differences. In FIG. 6, the estimate for this contribution to package standard deviation is about 0.3% MC.

In some embodiments, quantifying contributions from within-course differences can be accomplished identifying a random component and a systematic component. Point 606 in FIG. 6 (at about 1.6% MC) indicates the standard deviation for the average side-to-side moisture content profile in this particular package. It is a measure of the moisture variability that arises owing to uneven drying across the stack, and as such, it quantifies the systematic component of the within-course variability. The difference between that value and ideal package standard deviation provides an estimate of the moisture content variability that arises from random differences in drying rate between individual boards, that is, it provides an estimate of the random component of the within-course variability. In the example shown in FIG. 6, the contribution from that random variability is estimated to be about 0.7% MC.

In addition to using graphical methods, methods according to the disclosure contemplate the use of computational and statistical methods for quantifying contribution to overall variability. In embodiments according to the disclosure, suitable statistical methods may include, for example, random effects models and mixed effects models. Random effects models and mixed effects models allow for the estimation of variability assigned to different sources; see Kuehl, R. O. (2000) "Design of Experiments: Statistical Principles of Research Design and Analysis", Duxbury Press or Pinheiro, J. C., and Bates, D. M. (2000) "Mixed-Effects Models in S and S-PLUS", Springer, N.Y., both of which are hereby incorporated by reference. Conceptually, these models decompose the total variability of a sample into pre-specified components. For example, the random effects model represented in Equation 1 may be used in some embodiments of the disclosure to describe the variability in lumber moisture content, and to assign the variation to different sources.

$$MC_{ijk}=\mu+a_i+b_{ij}+\epsilon_{ijk} \qquad \text{Equation 1:}$$

In Equation 1, $MC_{ijk}$ is the moisture content of piece (e.g., a board) k from package j from charge i. The term μ represents the average moisture content for all pieces in a population. The term $a_i$ represents the difference between the mean value of charge i and the population mean μ. The term $b_{ij}$ represents the difference between the mean value of package j in charge i, and the charge mean $\mu+a_i$. The term $\epsilon_{ijk}$ is the difference between the moisture content value of piece k in package j in charge i, and the package mean $\mu+a_i+b_{ij}$.

Figure 7:
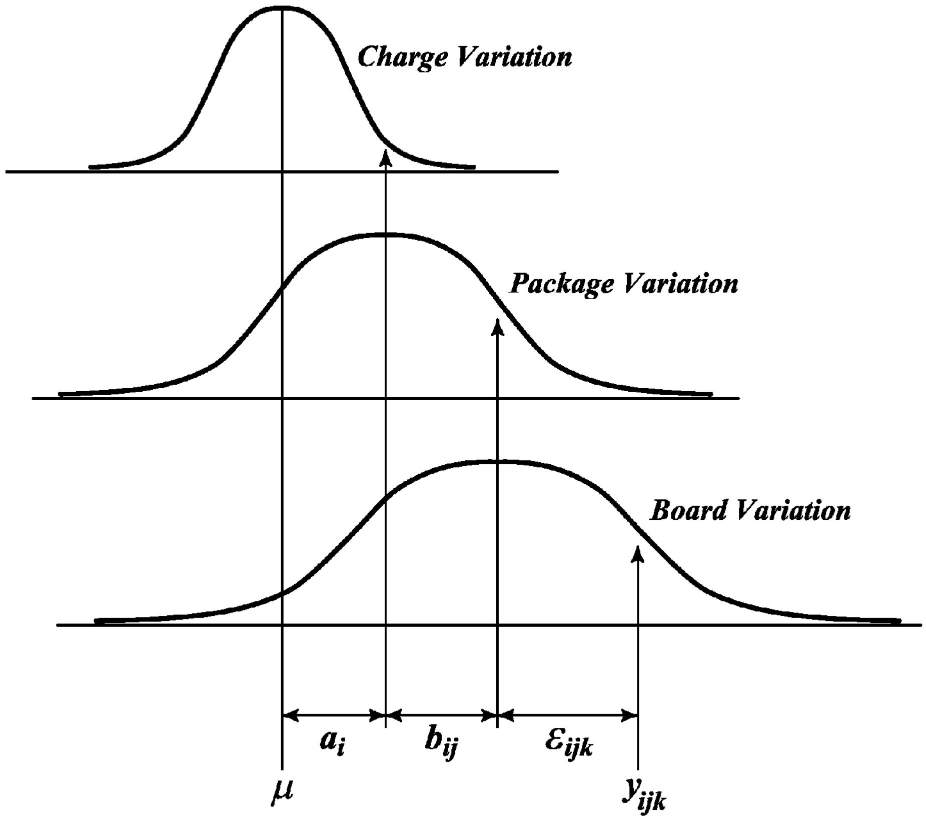
FIG. 7 is an exemplary conceptual depiction of source of variability in lumber drying according to embodiments of the disclosure.

FIG. 7 is an illustration of how the model represented in Equation 1 can be interpreted. Not all charges of lumber have the same mean moisture content and the mean moisture content of a given charge will generally fall randomly to one side or the other of the population average moisture content, μ. For example, charge i may have a mean moisture content that is $a_i$ different from the population mean. Within charge i, package j may have a mean moisture content that is $b_{ij}$ different from the mean moisture of charge i. Finally, piece k in package j of charge i may have a moisture content $y_{ijk}$, that is $\epsilon_{ijk}$, different from the mean moisture content of package ij.

According to embodiments of the disclosure, random effects models, such as the one represented by Equation 1, are used to estimate random, or unexplained, variability due to each of the sources. For example, from the model represented by Equation 1, computation methods may be used to estimate charge-to-charge variability (variance or standard deviation) in mean moisture content for a given set of data. In FIG. 7, the among-charge variance component is represented by the spread in the top distribution. Variance estimates for package-to-package and piece-to-piece variability may be obtained using similar methods. In FIG. 7, these variance components are represented by the spread in the bottom two distributions, respectively. In addition to estimating the variability, or variance components, associated with each of the random effects, computational methods may be used to estimate the population mean $\epsilon$, as well as the individual random effects, $a_i$, $b_{ij}$, $\epsilon_{ijk}$, for all i, j, and k.

Estimation of each component of variance further allows one to assign the relative contribution of each source of variability to the overall variability. For example, if a given set of data gave charge, package, and piece variance estimates of 2, 3, and 5, respectively, using the model represented by Equation 1, we would estimate that 20% (=2/(2+3+5)) of the variability among boards was due to charge-to-charge variability, while 30% was due to package-to-package variability.

Mixed effects models according to embodiments of the disclosure may be used as an extension of random effects models, combining the random effects discussed above with fixed effects that explain systematic variation in a sample. Equation 2 represents a mixed effects model that may be used to describe the variability in board moisture content that is assigned to both random effects and the systematic effect of package position.

$$MC_{ijk}=\mu+\beta\cdot x_{ij}+a_i+b_{ij}+\epsilon_{ijk} \qquad \text{Equation 2:}$$

In Equation 2, $MC_{ijk}$, $\mu$, $a_i$, $b_{ij}$, $\epsilon_{i,j,k}$, have the same definitions described with respect to Equation 1. The term $x_{ij}$ represents a continuous measure of package position within a charge. The term $\beta$ represents the linear effect of package position on piece moisture content. One distinction between the model represented by Equation 1 and the model represented in Equation 2 is that the latter can be used to describe the systematic variation in package moisture content with package position, as well as the among package variability that is not associated with package position.

It should be evident to a person of ordinary skill in the art that statistical models suitable for use with methods according to the disclosure are not limited to those represented by Equations 1 and 2. In addition, the sources of random variability or systematic variability are not limited to those in the examples above. A person of ordinary skill in the art will appreciate that there are many extensions to the basic forms of the models described above. Some examples include but are not limited to serial correlation, spatial correlation, and different variance functions such as power functions, exponential functions, and combinations of functions.

Several different computational methods may be used to estimate the quantities represented by random effects and mixed effects models. Traditionally, estimates of variance components were made using sum of squares decompositions, such as those commonly used for analysis of variance (ANOVA). Although relatively simple to implement, this approach is limited to simple random and fixed effects. More recently, computational advances allow for the estimation of random and mixed effects models via maximum likelihood, restricted maximum likelihood, or related methods. Such approaches allow for estimation of the extensions referred to in the previous paragraph. Conventional random or mixed effects models assume the variability in the response (e.g., moisture content) due to each source of variability (e.g., charge) is constant. In practice, however, there is often a relationship between the mean and the variance, as observed in FIGS. 4, 5 and 6.

In embodiments according to the disclosure, two approaches may be used to handle this mean-variance relationship: (a) transformation of the response; and (b) modeling the mean-variance relationship. In many cases, a transformation of the response variable can be used to decouple the variance of the data from the mean. Transformations suitable for use with methods according to the disclosure include the natural log and the square root; however, other transformations may be used. An example of a random effects model using a natural log transformation is represented by Equation 3:

$$\ln(MC_{ijk})=\mu+a_i+b_{ij}+\epsilon_{ijk} \qquad \text{Equation 3}$$

In Equation 3, the term In refers to the natural logarithm. All of the other terms are as defined as described with respect to Equations 1 and 2, except that the terms are defined on the natural log scale. In some embodiments, the mean-variance relationship may be explicitly modeled. A general class of statistical models that allow for structured mean-variance relationships include, for example, generalized linear mixed models.

Figure 8:
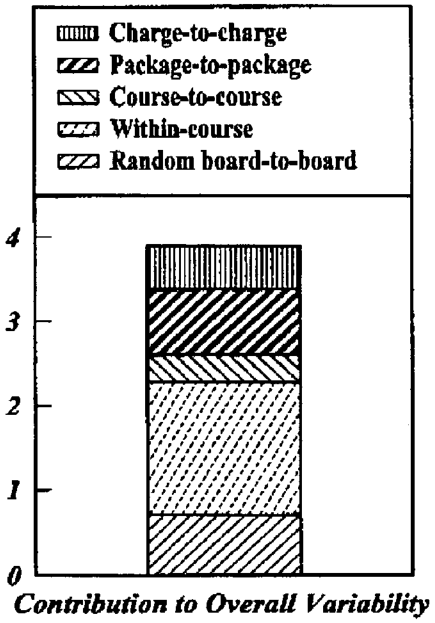
FIG. 8 is a bar chart summarizing the quantification of contributions to overall variability from each of the sources.

FIG. 8 is a chart summarizing the quantification of contributions to overall variability from each of the sources. Referring back to FIG. 3, methods according to the disclosure further include step 310, identifying one or more opportunities to impact the overall variability. Each opportunity is associated with one or more executable steps for impacting variability. Each opportunity may be related to value or to grade recovery in general. For example, in a kiln application, executable steps may include actions such as altering charge time for a kiln, altering airflow in a kiln, sorting wood products before drying, altering how wood products are stacked, adjusting temperature, repairing a malfunctioning component, changing fan configuration, or other steps which may affect overall variability or value of the wood products. Similar executable steps may be applied in situations which involve drying processes and drying devices other than kilns. For example other drying devices may include veneer dryers or rotary-drum dryers. Other drying processes may include air drying or shed drying. A person of ordinary skill in the art will appreciate that executable steps not explicitly listed herein are contemplated to be within the scope of the disclosure.

Methods according to embodiments of the disclosure may further include step 312, prioritizing the one or more executable steps. Examples of methods for prioritization are described, for example, in U.S. patent application Ser. No. 12/913,198, the contents of which are incorporated herein by reference. An output of prioritized steps may optionally be displayed on a computer screen or other suitable display mechanism. As depicted in step 314, the wood product manufacturing company may choose to optionally execute one or more of the steps. Accordingly, quantifying contributions to overall variability may enable effort and resources toward variability reduction to be directed in the most effective manner.

Those skilled in the art will appreciate that methods described in the disclosure may be implemented on any computing system or device. Suitable computing systems or devices include personal computers, server computers, multiprocessor systems, microprocessor-based systems, network devices, minicomputers, mainframe computers, distributed computing environments that include any of the foregoing, and the like. Such computing systems or devices may include one or more processors that execute software to perform the functions described herein. Processors include programmable general-purpose or special-purpose microprocessors, programmable controllers, application specific integrated circuits (ASICs), programmable logic devices (PLDs), or the like, or a combination of such devices. Software may be stored in memory, such as random access memory (RAM), read-only memory (ROM), flash memory, or the like, or a combination of such components. Software may also be stored in one or more storage devices, such as magnetic or optical based disks, flash memory devices, or any other type of non-volatile storage medium for storing data. Software may include one or more program modules which include routines, programs, objects, components, data structures, and so on that perform particular tasks or implement particular abstract data types. The functionality of the program modules may be combined or distributed as desired in various embodiments.

From the foregoing, it will be appreciated that the specific embodiments of the disclosure have been described herein for purposes of illustration, but that various modifications may be made without deviating from the disclosure. For example, modifications to the graphical and statistical methods that would be known to a person of ordinary skill in the art may be made without departing from the spirit of the disclosure. Words in the above disclosure using the singular or plural number may also include the plural or singular number, respectively. For example, a reference to a drying process could also apply to multiple drying processes, multiple drying devices, a single drying device, or various combinations thereof.

Aspects of the disclosure described in the context of particular embodiments may be combined or eliminated in other embodiments. For example, embodiments applied in one drying process (e.g., a kiln) or to a particular wood product (e.g., lumber) may be applied to other types of wood products (e.g., veneers) in other types of drying processes (e.g., air drying). In addition, sources of variability quantified according to methods described in the disclosure may include charge-to-charge differences, package-to-package differences, course-to-course differences, within-course differences, piece-to-piece differences, or any combination of these sources.

Further, while advantages associated with certain embodiments of the disclosure may have been described in the context of those embodiments, other embodiments may also exhibit such advantages, and not all embodiments need necessarily exhibit such advantages to fall within the scope of the disclosure. Accordingly, the invention is not limited except as by the appended claims.

We claim:

1. A method for reducing variability of moisture content in wood products dried in one or more drying devices, the method comprising the steps of:

(a) obtaining moisture content data for the wood products;

(b) identifying one or more sources of variability in the moisture content data;

(c) quantifying, using a processor, a contribution to overall variability from each of the one or more sources of variability, where step (c) is performed using a graphical or statistical method comprising the steps of:

(i) quantifying contribution to overall variability from charge-to-charge differences by: calculating a population-average moisture content from prior moisture content data, the prior moisture content data comprising two or more charges;

plotting standard deviation of each charge against average moisture content for each charge;

estimating a charge trend line;

estimating an ideal charge standard deviation, the ideal charge standard deviation being the standard deviation for two or more charges dried to the population-average moisture content; calculating an actual population standard deviation; and determining the contribution from charge-to-charge differences by determining a difference between the ideal charge standard deviation and the actual population standard deviation;

(d) quantifying one or more opportunities to impact the overall variability based on the one or more sources, each of the one or more opportunities being associated with one or more executable steps; and (e) performing one or more of the one or more executable steps on the wood products or on the one or more drying devices.

2. The method of 1, further comprising the steps of:

(f) prioritizing the one or more executable steps prior to step (e); and (g) displaying the prioritization from step (f) prior to step (e).

3. The method of 1 wherein the one or more sources of variability comprise charge-to-charge differences, package-to-package differences, course-to-course differences, within-course differences, and piece-to-piece differences.

4. The method of claim 1 wherein the graphical method comprises the steps of:

(ii) quantifying contribution to overall variability from package-to-package differences by:

calculating a charge-average moisture content from prior moisture content data, the prior moisture content data comprising two or more packages;

plotting standard deviation of each package against average moisture content for each package;

estimating a package trend line;

estimating an ideal package standard deviation, the ideal package standard deviation being the standard deviation for two or more packages dried to the charge-average moisture content;

calculating an actual charge standard deviation; and determining the contribution from package-to-package differences by determining a difference between the ideal package standard deviation and the actual charge standard deviation.

5. The method of claim 1 wherein the graphical method comprises the steps of:

(iii) quantifying contribution to variability from course-to-course differences by: calculating a package-average moisture content from prior moisture content data, the prior moisture content data comprising two or more courses;

plotting standard deviation of each course against average moisture content for each course;

estimating a course trend line;

estimating an ideal course standard deviation, the ideal course standard deviation being the standard deviation for two or more courses dried to the package-average moisture content; calculating an actual package standard deviation; and determining the contribution from course-to-course differences by determining a difference between the ideal course standard deviation and the actual package standard deviation.

6. The method of claim 1 wherein the graphical method comprises the steps of:

(iv) quantifying contribution to variability from piece-to-piece differences by:

calculating a course-average moisture content from the prior moisture content data, the prior moisture content data comprising two or more pieces;

creating a piece-average standard deviation plot by plotting standard deviation of each piece against average moisture content for each piece; estimating a piece trend line; estimating an ideal piece standard deviation, the ideal piece standard deviation being the standard deviation for two or more pieces dried to the course-average moisture content; calculating an actual course standard deviation; and determining the contribution from piece-to-piece differences by determining a difference between the ideal piece standard deviation and an actual course standard deviation.

7. The method of claim 1 wherein the graphical method comprises the steps of:

(v) quantifying a contribution to variability from within-course differences by: calculating a package-average moisture content from the moisture content data, the moisture content data comprising two or more courses;

plotting standard deviation of each course against average moisture content for each course;

estimating a course trend line;

estimating an ideal course standard deviation, the ideal course standard deviation being the standard deviation for two or more courses dried to the package-average moisture content;

calculating an actual package standard deviation;

determining a difference between the ideal course standard deviation and the actual package standard deviation;

identifying a random component in the difference between the ideal course standard deviation and the actual package standard deviation; and removing the random component to calculate the contribution from within-course differences.

8. The method of claim 1 wherein the statistical method comprises is a linear mixed-effects model, nonlinear mixed-effects model, least squares regression model, a least trimmed squares model, or a quantile regression model.

9. A method for reducing variability of moisture content in wood products dried using one or more drying devices, the method comprising the steps of:

(a) obtaining moisture content data for the wood products;

(b) identifying one or more sources of variability in the moisture content data;

(c) quantifying, using a processor, a contribution to overall variability from each of the one or more sources of variability, where step (c) is performed using a graphical or statistical method comprising the steps of:

(i) quantifying contribution to overall variability from charge-to-charge differences by: calculating a population-average moisture content from prior moisture content data, the prior moisture content data comprising two or more charges;

plotting standard deviation of each charge against average moisture content for each charge;

estimating a charge trend line;

estimating an ideal charge standard deviation, the ideal charge standard deviation being the standard deviation for two or more charges dried to the population-average moisture content; calculating an actual population standard deviation; and determining the contribution from charge-to-charge differences by determining a difference between the ideal charge standard deviation and the actual population standard deviation;

(d) quantifying one or more opportunities to impact the overall variability based on the one or more sources, each of the one or more opportunities being associated with one or more executable steps; and (e) prioritizing the one or more executable steps;

(f) selecting one or more executable steps based on prioritization from step (e); and (g) performing the one or more executable steps selected in step (f) on the one or more drying devices or on the wood products.

10. The method of claim 9 wherein the one or more sources of variability comprise charge-to-charge differences, package-to-package differences, course-to-course differences, within-course differences, and piece-to-piece differences.

11. The method of claim 9 wherein the wood products are selected from the group consisting of lumber, veneers, fiber, strands, and other products manufactured from logs.

12. The method of claim 9 wherein the one or more executable steps for improving the drying process comprise:

altering charge time for the one or more drying devices;

altering airflow in the one or more drying devices;

altering how the wood products are stacked;

sorting the wood products before the wood products are dried in the one or more drying devices;

repairing a malfunctioning component in the one or more drying devices; and changing fan configuration in the one or more drying devices.

13. The method of claim 9 wherein step (c) comprises the steps of:

(ii) quantifying a contribution to overall variability from package-to-package differences by:

calculating a charge-average moisture content from the prior moisture content data, the prior moisture content data comprising two or more packages;

plotting standard deviation of each package against average moisture content for each package;

estimating a package trend line;

estimating an ideal package standard deviation, the ideal package standard deviation being the standard deviation for two or more packages dried to the charge-average moisture content; calculating an actual charge standard deviation; and determining the contribution from package-to-package differences by determining a difference between the ideal package standard deviation and the actual charge standard deviation;

(iii) quantifying a contribution to variability from course-to-course differences by: calculating a package-average moisture content from the prior moisture content data, the prior moisture content data comprising two or more courses;

plotting standard deviation of each course against average moisture content for each course;

estimating a course trend line;

estimating an ideal course standard deviation, the ideal course standard deviation being the standard deviation for two or more courses dried to the package-average moisture content; calculating an actual package standard deviation; and determining the contribution from course-to-course differences by determining a difference between the ideal course standard deviation and the actual package standard deviation;

(iv) quantifying a contribution to variability from piece-to-piece differences by: calculating a course-average moisture content from the prior moisture content data, the prior moisture content data comprising two or more pieces;

plotting standard deviation of each piece against average moisture content for each piece;

estimating a piece trend line;

estimating an ideal piece standard deviation, the ideal piece standard deviation being the standard deviation for two or more pieces dried to the course-average moisture content; calculating an actual course standard deviation; and determining the contribution from piece-to-piece differences by determining a difference between the ideal piece standard deviation and an actual course standard deviation;

(v) quantifying a contribution to variability from within-course differences by: determining a difference between an ideal course standard deviation and an actual package standard deviation;

identifying a random component in the difference between the ideal course standard deviation and the actual package standard deviation; and removing the random component to calculate the contribution from within-course differences.

14. The method of claim 9 wherein the step of quantifying the contribution to overall variability from each of the one or more sources of variability is performed by a statistical method, the statistical method being a least squares regression model, a least trimmed squares model, or a quantile regression model.

15. A non-transitory computer-readable storage medium storing computer-executable instructions that, when executed, by a processor of a computing system, cause the computing system to:

receive moisture data for wood products;

quantify, using the processor, a contribution to overall variability from each of one or more sources of variability, wherein quantifying said contribution is performed using a graphical or statistical method comprising the steps of:

(i) quantifying contribution to overall variability from charge-to-charge differences by: calculating a population-average moisture content from prior moisture content data, the prior moisture content data comprising two or more charges;

plotting standard deviation of each charge against average moisture content for each charge;

estimating a charge trend line;

estimating an ideal charge standard deviation, the ideal charge standard deviation being the standard deviation for two or more charges dried to the population-average moisture content; calculating an actual population standard deviation; and determining the contribution from charge-to-charge differences by determining a difference between the ideal charge standard deviation and the actual population standard deviation;

quantify, using the processor, impact on variability associated with one or more opportunities, each of the one or more opportunities being associated with one or more executable steps; and output, using the processor, a prioritization of the one or more executable steps.

16. The non-transitory computer readable storage medium of claim 15 wherein the one or more sources of variability comprise charge-to-charge differences, package- to-package differences, course-to-course differences, within-course differences, and piece-to-piece differences.

17. The non-transitory computer readable storage medium of claim 15 wherein the contribution to overall variability from each of one or more sources of variability is quantified by computer-executable instructions that, when executed, cause the computing system to:

(ii) quantify, using the processor, a contribution to overall variability from package-to-package differences by: calculating, using the processor, a charge-average moisture content from the prior moisture content data, the prior moisture content data comprising two or more packages; plotting, using the processor, standard deviation of each package against average moisture content for each package; estimating, using the processor, a package trend line; estimating, using the processor, an ideal package standard deviation, the ideal package standard deviation being the standard deviation for two or more packages dried to the charge-average moisture content;

calculating, using the processor, an actual charge standard deviation; and determining, using the processor, the contribution from package-to-package differences by determining a difference between the ideal package standard deviation and the actual charge standard deviation;

(iii) quantify, using the processor, a contribution to variability from course-to-course differences by: calculating, using the processor a package-average moisture content from the prior moisture content data, the prior moisture content data comprising two or more courses; plotting, using the processor, standard deviation of each course against average moisture content for each course; estimating, using the processor, a course trend line; estimating, using the processor, an ideal course standard deviation, the ideal course standard deviation being the standard deviation for two or more courses dried to the package-average moisture content;

calculating, using the processor, an actual package standard deviation; and determining, using the processor, the contribution from course-to- course differences by determining a difference between the ideal course standard deviation and the actual package standard deviation;

(iv) quantify, using the processor, a contribution to variability from piece-to-piece differences by: calculating, using the processor, a course-average moisture content from the prior moisture content data, the prior moisture content data comprising two or more pieces; plotting, using the processor, standard deviation of each piece against average moisture content for each piece; estimating, using the processor, a piece trend line; estimating, using the processor, an ideal piece standard deviation, the ideal piece standard deviation being the standard deviation for two or more pieces dried to the course-average moisture content;

calculating, using the processor, an actual course standard deviation; and determining, using the processor, the contribution from piece-to- piece differences by determining a difference between the ideal piece standard deviation and an actual course standard deviation;

(v) quantify, using the processor, a contribution to variability from within-course differences by: determining, using the processor, a difference between an ideal course standard deviation and an actual package standard deviation;

identifying, using the processor, a random component in the difference between the ideal course standard deviation and the actual package standard deviation; and removing, using the processor, the random component to calculate the contribution from within-course differences.

18. The non-transitory computer readable storage medium of claim 15, further comprising computer-executable instructions that, when executed, cause the computing system to quanitfy the contribution to overall variability from each of one or more sources of variability using a least squares regression model, a least trimmed squares model, or a quantile regression model.

* * * * *